United States Patent
Eichmann et al.

(10) Patent No.: US 11,719,923 B2
(45) Date of Patent: Aug. 8, 2023

(54) SAMPLE HOLDER FOR USING MOUNTED SEM SAMPLES IN UPRIGHT AND INVERTED OPTICAL MICROSCOPES AND SPECTROMETERS

(71) Applicant: ARAMCO SERVICES COMPANY, Houston, TX (US)

(72) Inventors: Shannon Lee Eichmann, Katy, TX (US); Gary Eppler, Baytown, TX (US); Joshua Brothers, Sealy, TX (US); David Jacobi, Spring, TX (US)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 457 days.

(21) Appl. No.: 16/901,620

(22) Filed: Jun. 15, 2020

(65) Prior Publication Data
US 2021/0389579 A1    Dec. 16, 2021

(51) Int. Cl.
G02B 21/26 (2006.01)
G02B 21/34 (2006.01)

(52) U.S. Cl.
CPC ............. *G02B 21/34* (2013.01); *G02B 21/26* (2013.01)

(58) Field of Classification Search
CPC ...... G02B 21/002; G02B 21/06; G02B 21/34; G02B 21/24; G02B 21/26; G02B 21/362; G02B 21/367; H01J 37/20; H01J 2237/2007; G01N 21/13; G01N 23/20025; G01N 23/2204
See application file for complete search history.

(56) References Cited

U.S. PATENT DOCUMENTS

| | | |
|---|---|---|
| 4,159,875 A | 7/1979 | Hauser |
| 5,337,178 A | 8/1994 | Kung et al. |
| 6,303,932 B1 | 10/2001 | Hamamura et al. |
| 8,143,593 B2 | 3/2012 | Milas et al. |
| 8,482,854 B2 | 7/2013 | Lippert et al. |

(Continued)

FOREIGN PATENT DOCUMENTS

| | | | |
|---|---|---|---|
| DE | 03319495 A1 * | 11/1984 | ............ G02B 21/26 |
| DE | 3319495 A1 | 11/1984 | |

(Continued)

OTHER PUBLICATIONS

"PELCO SEM Specimen Holders, the Modular Concept", Apr. 25, 2016; XP055775274, Retrieved from the Internet: URL: https://www.tedpella.com/semmod_html/SEMmod1.htm (15 pages).

(Continued)

*Primary Examiner* — Mustak Choudhury
(74) *Attorney, Agent, or Firm* — Osha Bergman Watanabe & Burton LLP

(57) ABSTRACT

A mounting device for holding a sample mounted to a sample holder for use in an inverted microscope. The mounting device includes a platen; a mounting located on a sample side of the platen; a sample holder removably coupled to the mounting so the sample is along an optical axis of the inverted microscope; and a spacer shaped as a hollow prism or a hollow cylinder having a height and defining a through hole. The platen is disposed on the spacer with the sample side facing toward the spacer and the sample holder positioned within the through hole. The height of the spacer arranges the sample within a focal plane of the inverted microscope.

14 Claims, 10 Drawing Sheets

(56) References Cited

U.S. PATENT DOCUMENTS

| | | |
|---|---|---|
| 10,261,302 B1* | 4/2019 | Lyuboshenko ........ G02B 21/34 |
| 2002/0131167 A1 | 9/2002 | Nguyen et al. |
| 2007/0125947 A1 | 6/2007 | Sprinzak et al. |
| 2013/0068948 A1 | 3/2013 | Chen et al. |
| 2013/0146765 A1 | 6/2013 | Kitayama et al. |
| 2014/0268321 A1 | 9/2014 | Damiano, Jr. et al. |
| 2015/0021495 A1 | 1/2015 | Saito et al. |
| 2018/0277336 A1 | 9/2018 | Iwahori |
| 2019/0122853 A1 | 4/2019 | Ikeuchi et al. |
| 2021/0208038 A1* | 7/2021 | Bellaton .................. G01N 3/04 |

FOREIGN PATENT DOCUMENTS

| | | |
|---|---|---|
| KR | 20140147370 A | 12/2014 |
| WO | 2016052776 A1 | 4/2016 |
| WO | 2017057729 A1 | 4/2017 |

OTHER PUBLICATIONS

International Search Report and Written Opinion issued in Application No. PCT/US2020/042738, dated Feb. 23, 2021 (17 pages).

\* cited by examiner

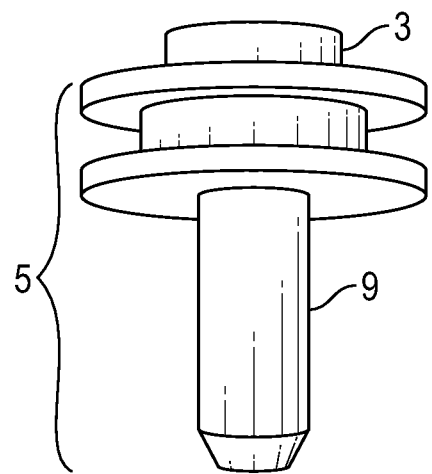
FIG. 2
(Prior Art)
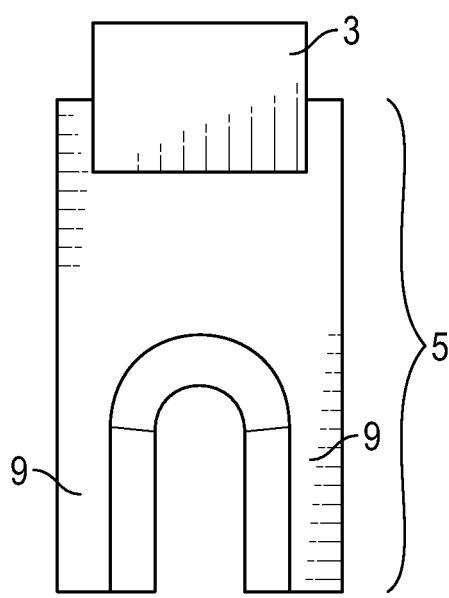 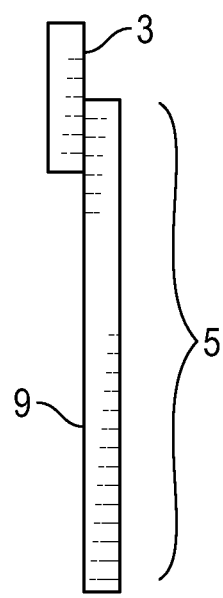
FIG. 3A　　　　　　　　FIG. 3B
(Prior Art)　　　　　　(Prior Art)

SAMPLE HOLDER FOR USING MOUNTED SEM SAMPLES IN UPRIGHT AND INVERTED OPTICAL MICROSCOPES AND SPECTROMETERS

BACKGROUND

Field

The disclosure relates generally to securing a laboratory sample during multiple characterization analysis.

Background Art

Optical microscopy, also called light microscopy, is a well-understood technique for visually studying the natural world. Fundamentally, optical microscopy uses lenses and visible light to view magnified images of a sample.

There are two major categories of optical microscopes: upright microscopes (as depicted in FIG. 1A) and inverted microscopes (as depicted in FIG. 1B). In an upright optical microscope, the sample 103 on a sample stage 107 sits below the objective lenses 101. An inverted optical microscope, on the other hand, places the sample 103 on a sample stage 107 above the objective lenses 101. All optical microscopes have an optical axis and a focal plane that is positioned a focal length away from the objective lens. These optical features, like the focal length, are characteristic of a particular microscope and depend on the geometry of that microscope and the optical properties of the objective lenses 101 within the microscope. A sample should be located along the optical axis and in the focal plane for proper imaging. An inverted microscope allows for easier sample manipulation during imaging that makes it advantageous for imaging biological samples and samples that naturally or artificially fluoresce.

In addition to visible light, optical microscopy can also be performed using ultraviolet (UV) light. Many inorganic samples, such as rocks and minerals, and organic samples, such as oils and other organic matter, may be characterized with fluorescence microscopy. The materials may fluoresce or phosphoresce when illuminated with particular wavelengths of light. Thus, fluorescence microscopes are often inverted because many fluorescence microscopes are optimized for studying biological samples.

Broadly, spectroscopy is the study of the response of a sample as it interacts with an incoming energetic source, such as electromagnetic radiation, particles, or acoustic waves. At the most basic, a sample is irradiated with an energetic source having known properties and an output signal is measured and analyzed to study the fundamental properties of the sample. In some spectroscopic techniques, this incoming radiation may be scanned, or rastered, across an area of interest so the output radiation may be measured at various positions to form a spectroscopic "map."

Scanning electron microscopy (SEM), which is electron microscopy rather than optical microscopy, uses a focused electron beam to image a sample at a magnification thousands of times greater than is possible with optical microscopy. Many chemical, crystallographic, elemental, and structural characterization techniques build upon additional information that results from the interaction between the incident electron beam and the sample.

Correlative microscopy analyzes a single sample with multiple tools. Correlative microscopy allows a better understanding of the interrelationship of multiple, measured properties and reduces uncertainty due to testing of multiple samples.

SUMMARY

In one aspect, embodiments disclosed relate to a mounting device for holding a sample mounted to a sample holder for use in an inverted microscope.

The mounting device includes: a platen; a mounting disposed on a sample side of the platen; a sample holder removably coupled to the mounting so the sample is along an optical axis of the inverted microscope; and a spacer shaped as a hollow prism or a hollow cylinder having a height and defining a through hole. The platen may be disposed on the spacer with the sample side facing toward the spacer and the sample holder positioned within the through hole. The height of the spacer arranges the sample within a focal plane of the inverted microscope.

In one or more embodiments, a position of the sample holder relative to the mounting may be adjustable.

In one or more embodiments, the mounting device may also include a window in at least one of the platen and the spacer.

In one or more embodiments, the mounting device may also include a window cover for covering the window.

In one or more embodiments, the spacer and the platen may be formed as an integral component.

In one or more embodiments, the mounting device may also include a leveler for leveling the sample.

In one or more embodiments, the leveler may include at least two screws inserted through the platen via at least two screw holes near a peripheral edge of the platen. An end of each of the at least two screws may extend from the sample side of the platen and contact an edge of the spacer when the platen is disposed on the spacer.

In one or more embodiments, the spacer may also include at least two blind holes on an edge of the spacer. When the platen is disposed on the spacer, each of the blind holes may receive one of the screws to removably connect and rotationally orient the platen to the spacer.

In one or more embodiments, the platen may also include at least two pins located near a peripheral edge of the platen and that extend from the sample side. Additionally, the spacer may also include at least two blind holes on an edge of the spacer. Thus, when the platen is disposed on the spacer, each of the blind holes may receive one of the pins to removably connect and rotationally orient the platen to the spacer.

In one or more embodiments, the mounting may be formed as an integral component of the platen.

The sample holder may be a scanning electron microscope (SEM) blade having at least one protrusion. In one or more embodiments, the mounting may further include: at least one indentation disposed on a sample-attachment side of the mounting that accommodates the at least one protrusion of the SEM blade; a backplate to orient and stabilize the SEM blade; and at least one fastener that removably holds the SEM blade in the mounting and against the backplate.

In one or more embodiments, the mounting device may further include at least one fastener to removably hold the sample holder in the mounting.

One or more embodiments describe a method for assembling a mounting device for use in an inverted microscope. This method includes: removably coupling a sample holder on a sample-attachment side of a mounting; disposing a platen side of the mounting on a sample side of a platen;

placing a spacer on the inverted microscope such that an optical axis of the inverted microscope passes through a designated through hole through the spacer; and disposing the platen on the spacer with the sample side of the platen facing toward the spacer such that the sample holder is positioned within the through hole and a sample is along the optical axis and within a focal plane.

In one or more embodiments, the method may further include closing a window cover over a window in at least one of the platen and the spacer to limit ambient illumination of the sample.

In one or more embodiments, the method may further include leveling the sample using a leveler.

In one or more embodiments, removably mounting the sample holder on the sample-attachment side of the mounting may include: inserting at least one protrusion of the sample holder into an indentation in the mounting; and fastening the sample holder to the mounting using at least one fastener.

One or more embodiments describe a method for assembling a mounting device for use in microscopes. The method includes: removably mounting a sample holder on a sample-attachment side of a mounting; disposing a platen side of the mounting on a sample side of a platen; placing the platen on an upright microscope with a sample side of the platen facing toward an objective lens; removing the platen from the upright microscope and inverting the platen together with the mounting; disposing the inverted platen on a spacer with the sample side of the platen facing toward the spacer; and placing the spacer and the inverted platen on an inverted microscope such that an optical axis of the inverted microscope passes through a through hole defined by the spacer.

In one or more embodiments, the method may further include leveling a sample disposed in the sample holder using a leveler.

In one or more embodiments, the mounting may be removable from the platen.

In one or more embodiments, removably mounting the sample holder on the sample-attachment side of the mounting may include: inserting at least one protrusion of the sample holder into an indentation in the mounting; and fastening the sample holder to the mounting using at least one fastener.

Other aspects and advantages provided in the detailed description of specific embodiments of the present disclosure will be apparent from the following description and the appended claims.

BRIEF DESCRIPTION OF DRAWINGS

Certain embodiments of the disclosure will be described with reference to the accompanying drawings, where like reference numerals denote like elements. It should be understood, however, that the accompanying figures illustrate the various implementations described and are not meant to limit the scope of various technologies described.

FIG. 2 depicts a prior art SEM stub sample holder with sample.

FIGS. 3A and 3B depict a front view and a side view, respectively, of a prior art SEM blade sample holder with sample.

DETAILED DESCRIPTION

Figure 1A:
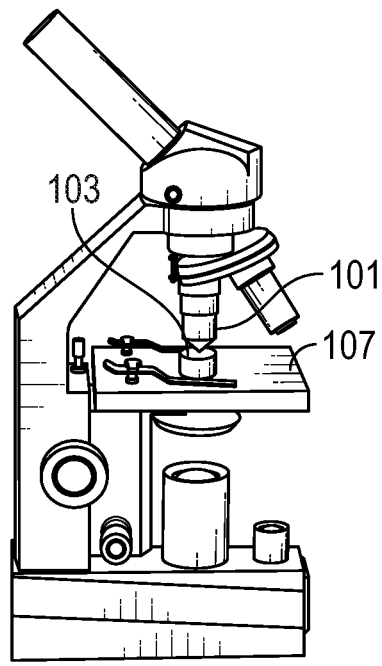
FIGS. 1A and 1B depict a schematic of a prior art upright microscope and a prior art inverted optical microscope, respectively.

Briefly, one or more embodiments described here relate to a mounting device for a sample holder that facilitates correlative microscopy. Put another way, this disclosure describes an apparatus for securing a sample holder, termed a "mounting device."

SEM and ion milling (a common technique for preparing SEM samples) often require samples to be attached to specialized sample holders 5 such as those depicted in FIGS. 2 and 3A-3B. These commercially-available sample holders 5 take a variety of forms, but many of them have geometries that pose challenges when attempts are made to employ other instruments because they include one or more protrusions 9 opposite the sample 3. For example, FIG. 2 depicts a sample 3 being held in one example of a sample holder 5, in this case an SEM stub. This sample holder 5 has a single protrusion 9. FIG. 3A-3B depicts an SEM blade from the front and side, respectively. The SEM blade is a second example of a sample holder 5 for holding a sample 3. This sample holder 5 includes two protrusions 9. Both the SEM stub depicted in FIG. 2 and SEM blade depicted in FIGS. 3A-3B include at least one protrusion 9. These protrusions 9 are designed to interface with the specialized holders used in SEM and ion milling instruments. However, when not actively within these instruments, the protrusions 9 impede the use of the sample holders 5 apart from these specialized SEM/ion mill holders. However, because SEM samples 3 are often small, fragile, or both, removing them from the SEM sample holder 5 for additional imaging/characterization may be difficult or impossible.

Imaging and data acquisition from optical microscopy as well as many spectroscopy methods (for example, reflection, transmission, fluorescence, Raman, Fourier-transform infrared spectroscopy (FTIR), or energy-dispersive X-ray spectroscopy (EDS)) require the sample either to be fixed to a glass coverslip or the region of interest (ROI) on the sample surface to be perpendicular to the optical axis. Because of the location of objective lens 101 depicted in FIG. 1A, upright optical microscopy requires the sample-side of a sample 3 to face the objective lens, and thus face upwards. A sample positioning for Raman spectroscopy, FTIR, EDS, and others is often similar to that of upright microscopy (sample side-up), although there may be tighter geometric requirements for a particular instrument due to the locations of the laser and sensor. However, both sample holders 5 (an SEM stub (FIG. 2) and an SEM blade (FIGS. 3A-3B)) have one or more protrusions 9 that prevent them from being placed sample-side up on a flat surface like the sample stage 107 of an upright optical microscope (FIG. 1A). Furthermore, a sample 3 in the sample holder 5 must be located along the optical axis and within the focal plane of the microscope in order to be imaged properly.

Figure 1B:
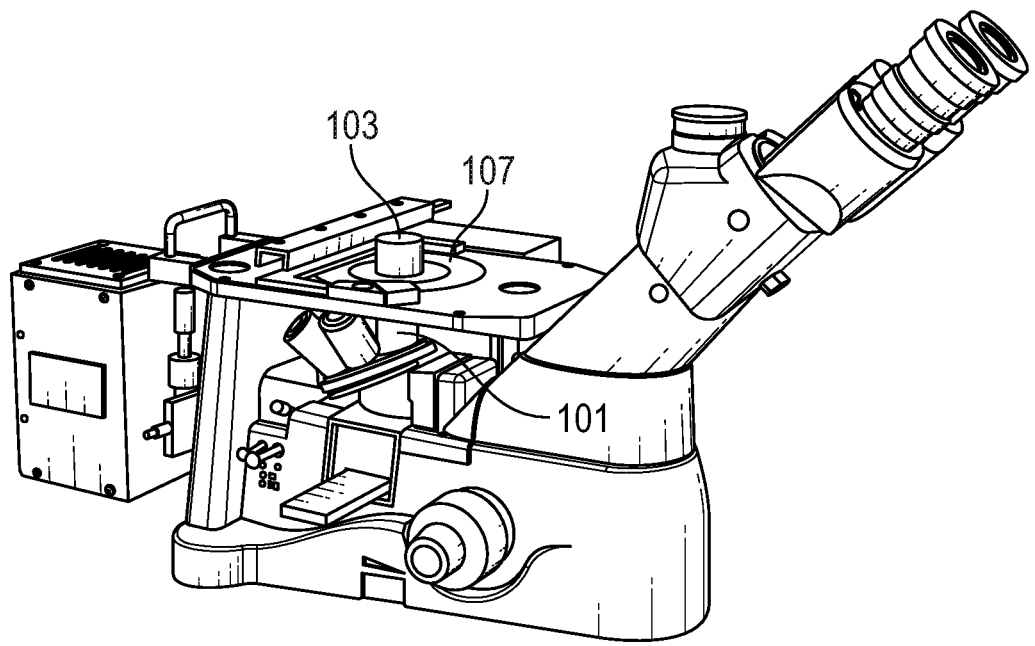

Inverted optical microscopes also require a sample 3 in the sample holder 5 to be located along the optical axis and within the focal plane in order to be imaged properly. Additionally, as seen in FIG. 1B, inverted optical microscopy of non-transparent inorganic samples often requires placing a sample 103 on the sample stage 107 over the objective lenses 101 with the area of interest of the sample 103 facing downward. However, placing a surface of interest down onto a transparent sample stage 107 or coverslip could damage the fragile, delicate surface of interest. Further, the interface between the coverslip or transparent sample stage and the sample may cause excessive aberrations in an image collected, particularly when working at a small working distance as is required for high-resolution fluorescence techniques like confocal microscopy. Finally, it may be impossible for a sample 103 mounted to a sample holder 5 such as the SEM blade depicted in FIGS. 3A-3B to be placed sample-side down because of the holder's 5 non-ideal geometry (meaning geometry that includes one or more protrusions 9). Many inverted microscopes have a hole in the sample stage 107 above the objective lenses 101 through which the sample 3 may be imaged. In such a system, to avoid placing the sample 3 on a coverslip, the sample 3 may instead be securely suspended in an inverted fashion over the objective lens 103 by some sort of structure that rests atop the sample stage 107.

The light (for example, visible light) generated by the incoming light (for example, UV light) during florescence microscopy is often dim compared to the normal, ambient light present in an occupied space. When it is detected by the detector, this ambient light generates noise in an image, reducing the image quality. Furthermore, ambient light may reflect off the sample or interact with the sample in some other way, causing image artifacts. Consequently, ambient light can reduce the quality of florescence microscopy images due to noise and artifacts. Therefore, florescence microscopy optimally is performed in a dark environment that includes the sample and all the pertinent microscope components (such as the objective lenses, the illumination source, the eyepiece, and the digital camera/imaging device). For at least these reasons, a mounting device for florescence microscopy may help enclose or otherwise shield the sample and many of the microscope components from ambient illumination.

A sample may be prepared and mounted in a particular configuration dictated by the individual microscope being used. Therefore, workflows that aim to combine information gathered using different microscopy methods on the same sample can be challenging because a sample mounted to fit the configuration for one instrument may not be in an optimal configuration to fit a second instrument.

The present disclosure provides a mounting device for securing a sample holder useful for a first analytical technique, such as SEM, to be configured for a second or additional analytical techniques, such as imaging and spectroscopy, having either upright or inverted geometry. The mounting device does not require modification to the original, specialized sample holder. Additionally, the mounting device may allow the sample to be imaged with a microscope by positioning the sample within its focal plane. Finally, while embodiments describe a mounting device for holding SEM sample holders, one or more embodiments of the mounting device described may also accommodate sample holders designed for use in other microscopic or spectroscopic devices.

Figure 4:
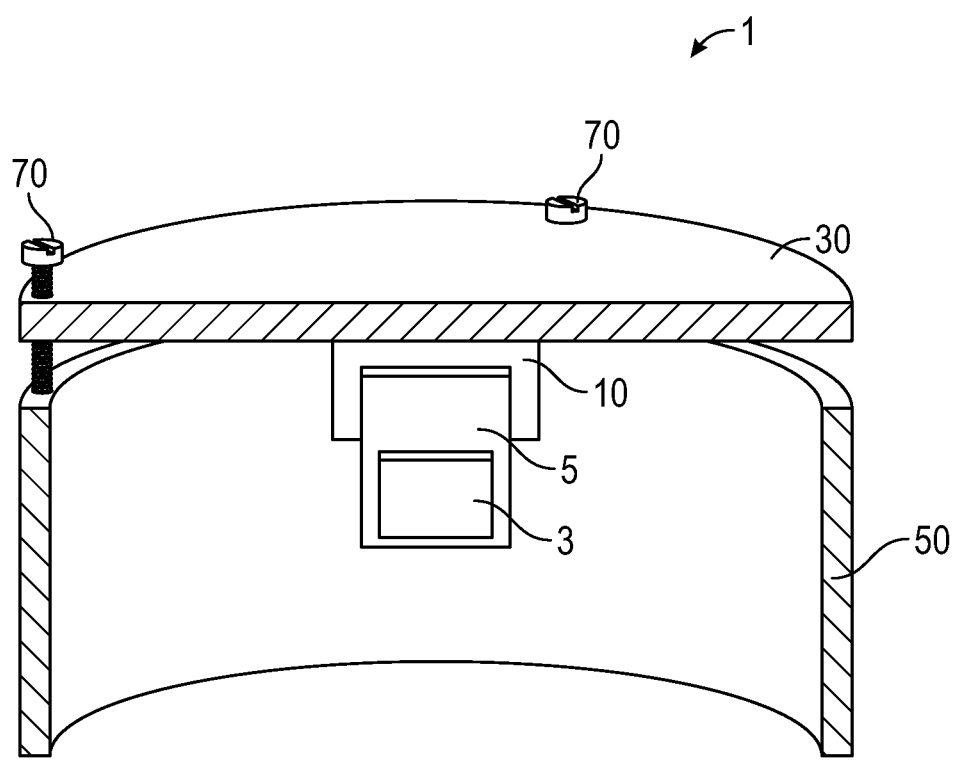
FIG. 4 shows a cross-sectional schematic of an assembled mounting device, according to one or more embodiments.

FIG. 4 depicts an embodiment of the retaining device for sample holders. Broadly, a mounting device 1 may include a mounting 10, a platen 30, a spacer 50, and a leveler 70. The mounting 10 holds a sample holder 5 to which a sample 3 may be mounted. The platen 30 holds the mounting 10. The spacer 50 may allow proper positioning of the platen 30, and thus the sample 3, over the objective lenses of an inverted microscope (not shown). The leveler 70 adjusts to compensation for any tilt of a surface of the sample 3 for proper imaging or spectroscopy. While the mounting device 1 depicted in FIG. 4 includes leveler 70, one or more embodiments may not include a leveler 70, that is, leveler 70 is optional. Each of these components will later be discussed in further detail.

Figure 5A:
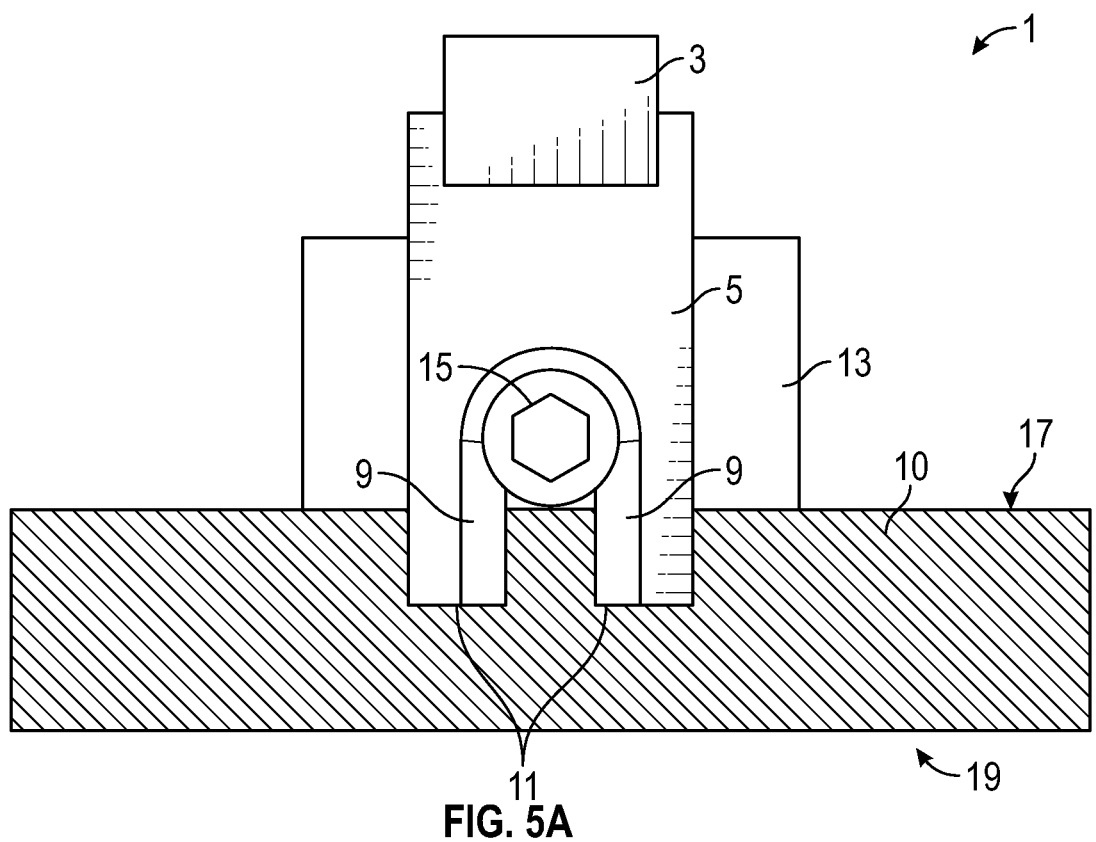
FIGS. 5A and 5B are a schematic of a mounting holding an SEM blade sample holder, according to one or more embodiments.
Figure 5B:
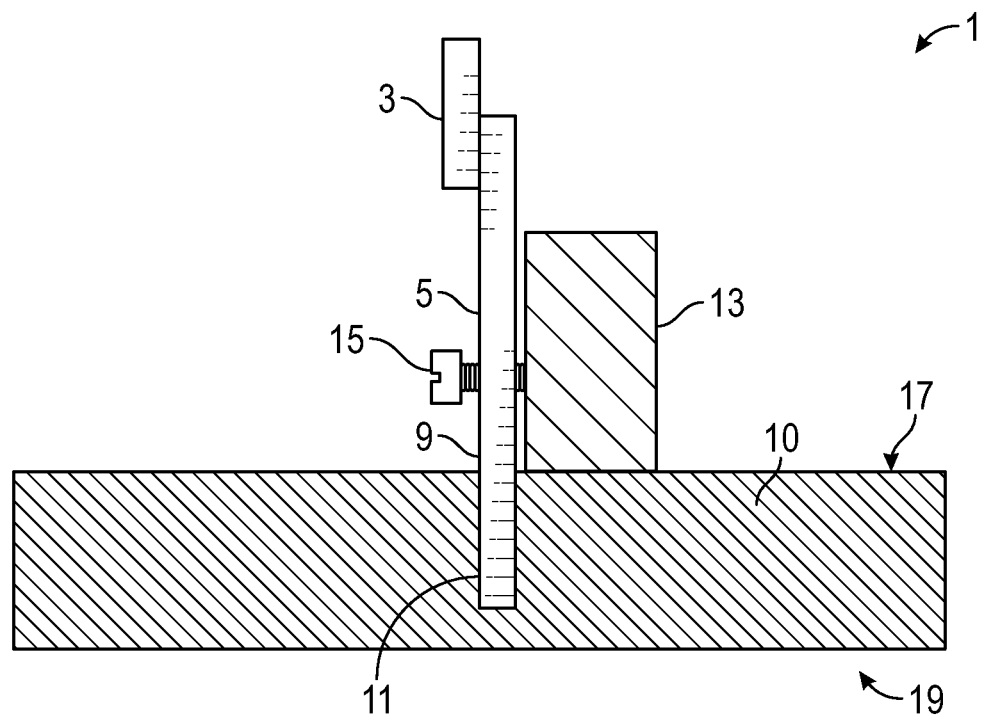
Figure 6:
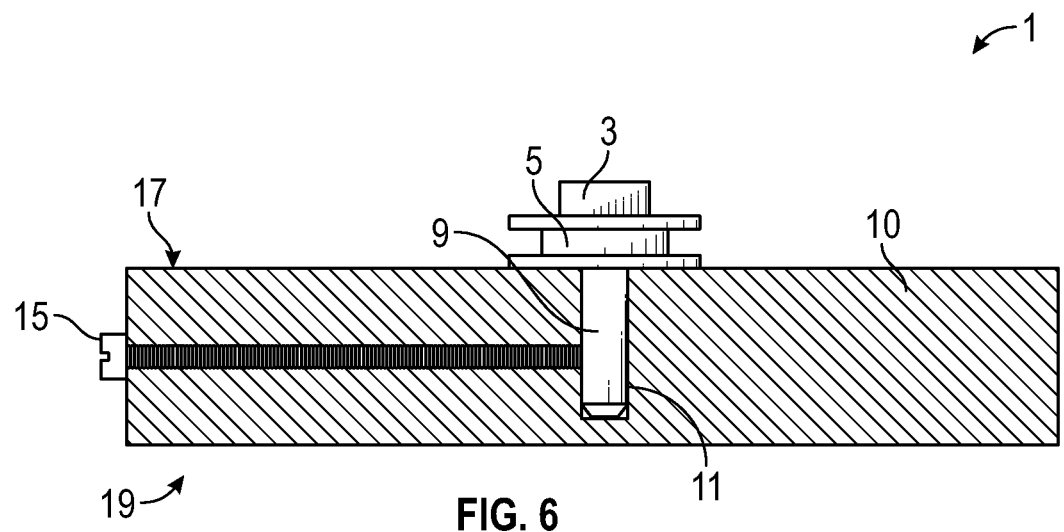
FIG. 6 is a schematic of a mounting holding an SEM stub sample holder, according to one or more embodiments.

Referring now to FIGS. 5A-5B and 6, some embodiments of a retaining device such as a mounting device 1 for sample holders like mounting 10 that is separated from a platen 30 (FIG. 4) are shown. The mounting 10 holds a sample holder 5 within a mounting device 1 (FIG. 4). The mounting 10, thus, may have a shape that corresponds to the sample holder 5 of interest.

FIGS. 5A and 5B depict a cross-sectional view from a front view and a side view, respectively, of one embodiment of a mounting 10 holding a sample 3 in a sample holder 5 having the form of an SEM blade with two protrusions 9. A mounting may have a sample-attachment side 17 and a platen side 19, in one or more embodiments.

The mounting 10 depicted in FIGS. 5A and 5B includes two indentations 11, each of which is configured to accommodate one of the two protrusions 9 of the sample holder 5. The number of indentations, the distance between the indentations, and the geometry of the indentations, including their shape, depth, and size, may reflect the geometry of an engagement surface (including protrusions 9) of one or more sample holders 5 to be held in the mounting 10. The indentations 11, and therefore the sample holder 5 when it is coupled to the mounting 10, may be on the sample-attachment side 17 of the mounting 10.

The mounting 10, as depicted in FIGS. 5A and 5B, may further include a backplate 13. The backplate 13 may serve as a support for the sample holder 5, an attachment point for a fastener 15, or both. One or more backplates 13, and therefore the sample holder 5 once it is coupled to the mounting, may be on the sample-attachment side 17 of the mounting.

The geometry of the one or more backplates 13, including their shape and size, may reflect the geometry of one or more sample holders 5 to be held in the mounting 10. In the embodiment depicted in FIGS. 5A and 5B, the sample holder 5 extends further away from the mounting 10 than the backplate 13. In some embodiments, the backplate 13 may extend further from the mounting 10 than the sample holder 5. In other embodiments, the backplate 13 and the sample holder 5 may extend roughly the same distance from the mounting 10. In other words, a height of the backplate 13 as measured from the surface of the sample-attachment side 17 of the mounting 10 may be less than or greater than (or in some embodiments, equal to) a height of the sample holder 5 as measured from the surface of the sample-attachment side 17 of the mounting 10. A surface of the backplate 13 towards the sample holder 5 may be substantially level to allow sample holder 5 to be supported against the backplate 13. "Substantially" means within ±10%, within ±5%, within ±1%, within ±0.1% or within ±0.01%. Alternatively, the surface of the backplate 13 towards sample holder 5 may include a cutout having a shape that corresponds to the shape of sample holder 5. Other surfaces of the backplate 13, away from sample holder 5 and platen 30, may have a variety of shapes. In embodiments of the mounting device 1, the backplate 13 as a whole may have various configurations, including but not limited to, rectangular prismatic, cubic, plate-like, half-cylindrical, or prismatic, so long as sample holder 5 is supported by the backplate 13.

The backplate 13 shown in FIGS. 5A and 5B may be formed as an integral part of the mounting 10, such that it is operable as a singular unit or piece. Such would be the case if the two components were either permanently joined, such as by welding, or were fabricated from a single piece of material, such as by additive manufacturing techniques or molding.

In one or more embodiments, the backplate 13 may be configured such that it is detachable and removable from the mounting 10. In such an embodiment, the backplate 13 may then be removed to accommodate sample holders 5 that do not need a backplate. In such an embodiment, the backplate 13 may be attached to the sample-attachment side 17 of the mounting 10 via any fastening method known in the art. One such fastening method may be a screw that extends from the platen side 19 of the mounting 10, through the mounting 10, and into the backplate 13. Other fastening methods that are well known to people in the art may also be employed.

To hold the sample holder 5 in the mounting 10, one or more fasteners 15 may be employed. Firmly holding the sample holder 5 in the mounting 10 may be important for any inverted uses, such as inverted microscopy (FIG. 1B). In other embodiments, the sample holder 5 may be press-fit into the indentations 11 of the mounting 10. Furthermore, the selection and geometry of the one or more fasteners 15 may depend upon the geometry of the sample holder(s) 5 to be held in the mounting 10.

As shown in FIGS. 5A and 5B, the fastener 15 may be a set screw that fits between the two protrusions 9 of the sample holder 5 and screws into the backplate 13. However, as will be detailed with respect to FIGS. 6 and 8B, a number of additional fastener types and methods may be employed to hold the sample holder 5 in the mounting 10. A person of ordinary skill in the art would readily appreciate that fasteners beyond the three embodiments described may be used to removably hold the sample holder 5 in place, including screw(s), bolt/nut set(s), set screw(s), clamp(s), and other fasteners and fastening mechanisms well known in the art. Furthermore, the particular geometry and material of the sample holder 5 along with other factors, such as sample geometry, sample type, and need for electrical connection/grounding, may inform the design and selection of the fastener to be used.

Figure 8A:
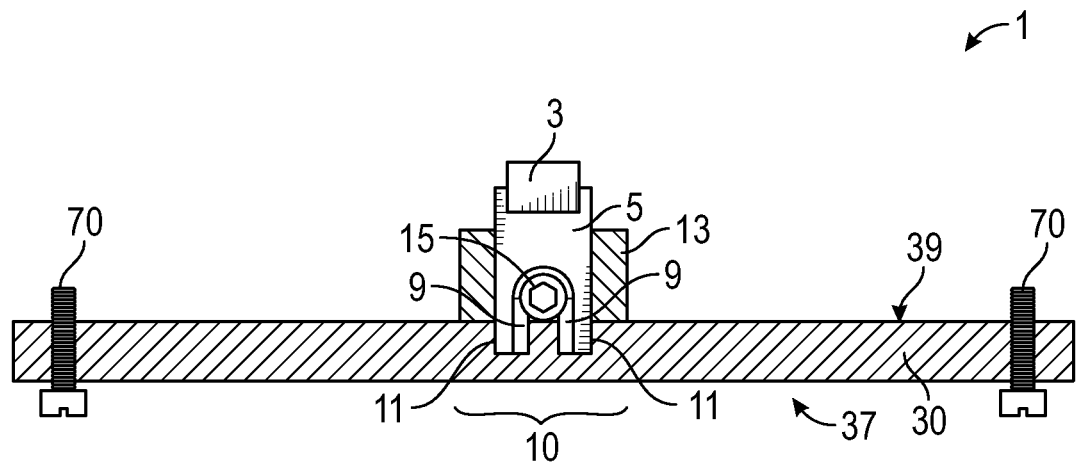
FIGS. 8A and 8B show platens with non-separable mountings, according to one or more embodiments.
Figure 8B:
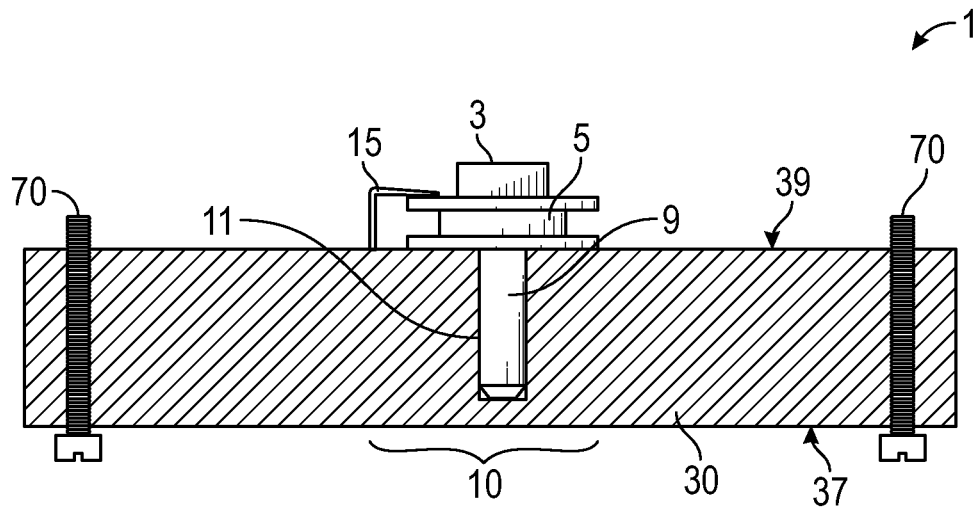

Furthermore, while the fastener 15 in FIGS. 5A and 5B indirectly attaches to the mounting 10 via the backplate 13, one or more embodiments may include a fastener that is a part of the mounting 10 or attaches directly to the mounting 10 or platen (FIGS. 4 and 8B).

In one or more embodiments, the position of the sample holder 5, and thus of the sample 3, may be adjusted relative to the mounting 10 and thus the mounting device (FIG. 4). In one or more embodiments, by adjusting the position of the sample holder 5 within the mounting 10, a user may alter the position of the sample 3 in relationship to the mounting device (FIG. 4), which may position the sample 3 within the focal plane of the microscope objective. In one or more embodiments, by adjusting the position of the sample holder 5 relative to the mounting 10, the sample 3 may be positioned within the focal plane of the microscope objective. In the embodiment depicted in FIGS. 5A and 5B, the height of the sample 3 in relation to the mounting 10 may be varied by adjusting the height of the sample holder 5 within the mounting 10 prior to tightening the fastener 15.

FIG. 6 depicts an embodiment of the mounting device 1 where the mounting 10 that accommodates a sample 3 in a sample holder 5 in the shape of an SEM stub with a single protrusion 9. The sample holder 5 is held on a sample-attachment side 17 of the mounting 10, which is opposite a platen side 19 of the mounting 10. This embodiment of the mounting 10 depicted has one indentation 11 that accommodates the protrusion 9 of the sample holder 5. One of ordinary skill in the art will appreciate that other configurations of protrusions and indentations as well as other connections or attachment mechanisms may be used so long as the sample holder 5 and a mounting 10 have corresponding geometries. Such a corresponding geometry may allow the sample holder 5 to engage a surface of the mounting 10 so the sample holder 5 may be secured to the mounting 10. For example, the sample holder 5 may include two or more protrusions 9. As well, the mounting 10 may include a corresponding number of indentations 11 configured to receive and secure the protrusions.

Furthermore, FIG. 6 depicts an additional fastener and fastening mechanism and fastener 15 that may be employed in one or more embodiments of this disclosure. Note, the mounting 10 depicted in FIG. 6 does not have a backplate because the geometry of some sample holders, such as the SEM stub depicted, may not require it. Thus, the fastener 15 in this mounting 10 does not attach into a backplate. Instead, the fastener 15 employed in this mounting 10 is a set screw that extends radially into the mounting 10 such that it traverses into the indentation 11 and contacts the protrusion 9. Such contact holds protrusion 9 against an opposite wall of the indentation 11.

As in the embodiment depicted in FIGS. 5A and 5B, the exact location of the sample 3 relative to the mounting 10 depicted in FIG. 6 may be varied by adjusting the location (such as height) of the sample holder 5 within the mounting 10 prior to tightening the fastener 15 to secure the protrusion 9.

Each sample holder 5 has a particular geometry, including the number, size, and shape of any protrusions 9, as well as the location and orientation of a sample 3 on the sample holder 5. Furthermore, the particular geometry of a sample holder 5 may encourage or necessitate the use of a backplate 13. Accordingly, one or more embodiments of the mounting 10 may be designed specifically for use with one or more sample holders 5 with a known geometry.

The mountings 10 depicted in FIGS. 5A-5B and 6 only accommodate a single sample holder 5. However, the mounting according to one or more embodiments may simultaneously accommodate a plurality of sample holders. Similarly, the mountings 10 depicted in FIGS. 5A-5B and 6 only accommodate a single type/style of sample holder 5. However, mounting 10 according to one or more embodiments may accommodate multiple styles/types of sample holders 5 (meaning, sample holders 5 having different geometries), either simultaneously or successively.

In one or more embodiments, the mounting 10 may allow the precise location of the sample holder 5, and thus of the sample 3, to be adjusted relative to the mounting 10. While the embodiments depicted may only allow the height of the sample holder 5 within the mounting 10 to be adjusted, one or more embodiments may include more adjustment axes (that is, the X-Y plane that is perpendicular to the height, which is assumed to be the Z direction) of the sample holder 5 relative to the mounting 10. While the embodiments depicted may only allow the location of the sample holder 5 within the mounting 10 to be coarsely adjusted, one or more embodiments may accommodate finer positioning of the sample holder 5 relative to the mounting 10. While the embodiments depicted may only allow the location of the sample holder 5 within the mounting 10 to be adjusted manually, one or more embodiments may accommodate digital or computerized positioning of the sample holder 5 relative to the mounting 10. In some embodiments, the mounting 10 may include the ability to finely alter the location of the sample holder 5 and, thus, the sample 3, in all three spatial directions relative to the mounting 10. In some embodiments, moving the sample holder 5 relative to the mounting 10 may be performed after the sample holder 5 is coupled to the mounting 10, for example, once the mounting 10 is within a mounting device (FIG. 4) atop an inverted microscope (FIG. 1B). Adjusting the position of the sample holder 5 relative to the mounting 10 may occur before, simultaneously with, or after, coupling the sample holder 5 to the mounting 10 depending upon the adjustment method and overall design of a mounting device (FIG. 4).

Figure 7A:
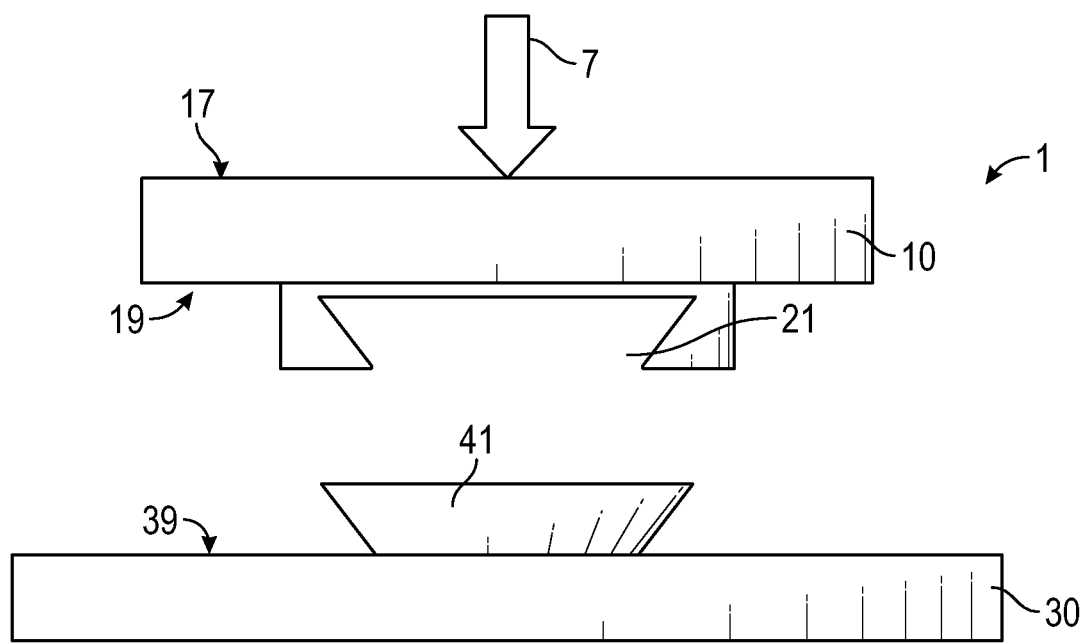
FIGS. 7A and 7B depict a mounting and a platen that are separable, according to one or more embodiments.
Figure 7B:
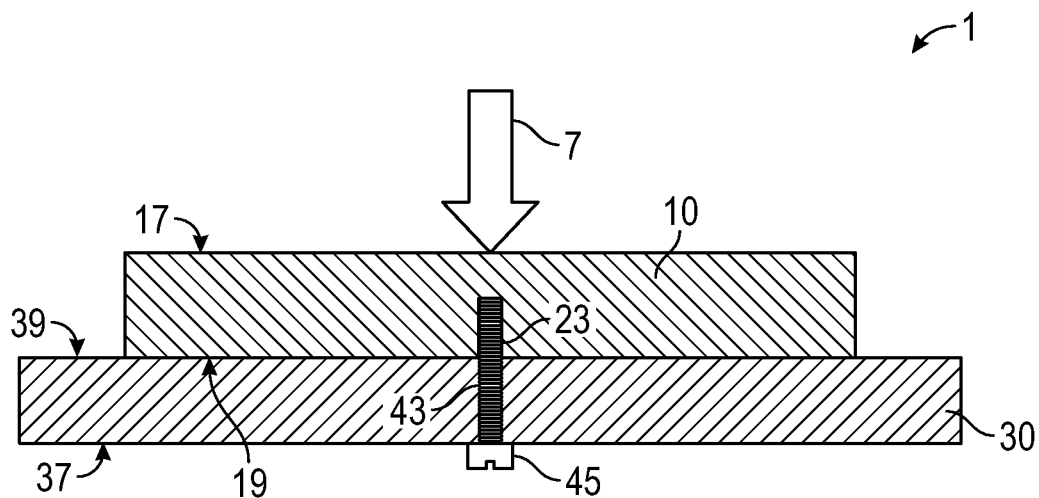

As depicted in FIG. 4, a platen 30 is a plate-shaped component of a mounting device 1 that, either directly or indirectly, holds one or more sample holders 5. In the embodiments depicted in FIGS. 5A-5B and 6, a mounting 10 and a platen 30 are separate components of mounting device 1. By being separable, a mounting device (FIG. 4) and, thus, the platen 30, could accommodate interchangeable mountings 10. In such a system, each mounting 10 may be configured for the particular geometry necessary to attach one or more sample holders 5 of interest. FIGS. 7A and 7B show embodiments of the coupling of the mounting 10 to the platen 30. In FIGS. 7A and 7B, sample holder location 7 (indicated with an arrow) corresponds to an approximate area where a sample holder 5 (such as in FIGS. 4, 5A-5B, and 6) may be attached on a sample attachment side 17 of the mounting 10, according to one or more embodiments of mounting device 1.

FIGS. 7A and 7B show two different embodiments of coupling mechanisms for coupling a mounting 10 and a platen 30. One having skill in the art will readily appreciate the many additional structures that may be used to removably attach or couple the mounting 10 to the platen 30 beyond those described in the following and depicted in FIGS. 7A and 7B. Thus, the discussion is not intended to be limiting, but is instead intended to depict one or more embodiments.

FIG. 7A depicts a mounting 10 and a platen 30 that employs a dovetail pin and dovetail socket system according to one or more embodiments. In this system, a dovetail pin 41 may be found on a sample side 39 of the platen 30 and a dovetail socket 21 may be found on a platen side 19 of a mounting 10. When viewed from above, the dovetail pin 41 may take any shape or profile (for example, round, square, or rectangle) and, when viewed from the side, the dovetail pin 41 may have a second shape or profile (for example, round, square, rectangle, or dovetail). The dovetail socket 21 may have a corresponding shape to the dovetail pin 41 such that the dovetail pin 41 fits within the dovetail socket 21. Therefore, to attach the mounting 10 to the platen 30 having a dovetail configuration, the dovetail socket 21 may be slid over the dovetail pin 41.

FIG. 7B depicts a mounting 10 and a platen 30 that employs a screw system according to one or more embodiments. In this system, the platen 30 may have a thread hole 43 that extends from an opposite side 37 to a sample side 39, while a platen side 19 of the mounting 10 may have a threaded hole 23. Thus, the mounting 10 may be attached to the platen 30 by an attachment 45 (such as a screw) that extends through the thread hole 43 in the platen 30 (from the opposite side 37 to the sample side 39) into the threaded hole 23 in the mounting 10. To attach the mounting 10 to the platen 30, the attachment 45 may pass through the thread hole 43 and be tightened in the threaded hole 23.

Alternatively, one or more embodiments may not accommodate a mounting 10 that may be removed from a platen 30. For example, the mounting 10 may be an integral component of the platen 30. In such a device, the mounting 10 may be a region of the platen 30 on a sample side 39 where a sample holder 5 may be attached.

FIGS. 8A and 8B depict one or more embodiments of mounting device 1 where the mounting 10 is a region of the platen 30. FIG. 8A depicts a platen 30 having a mounting 10 that is not separate from the platen 30 (for example, integrally formed or welded together) and that accommodates a sample holder 5 in the form of an SEM blade (FIG. 2A-2B) holding sample 3. Since this integrally formed mounting 10 and platen 30 accommodates the same sample holder as shown in FIGS. 5A and 5B, the structures necessary to accommodate the sample holder 5 in FIG. 8A are similar to those depicted in FIGS. 5A and 5B; however, the structures in FIG. 8A are directly on the platen 30 instead of being on a separable mounting 10. Thus, the platen 30 in the mounting 10 region has two indentations 11 for accommodating the two protrusions 9 of the sample holder 5. Furthermore, the platen 30 has a backplate 13 into which a fastener 15 in the form of a set screw may be used to attach the sample holder 5 to the platen 10. Leveler 70 extends from an opposite side 37 to a sample side 39.

FIG. 8B depicts a platen 30 having a mounting 10 integrally formed with platen 30 that accommodates a sample holder 5 in the form of an SEM stub (FIG. 3) holding sample 3. Since the integrally formed platen 30 with mounting 10 region accommodates the same sample holder 5 as FIG. 6, the structures necessary to accommodate the sample holder 5 in FIG. 8B are similar to those depicted in FIG. 6. As previously described, the sample holder 5 has a protrusion 9 that may be inserted into an indentation 11. However, there are two key differences. First, as previously described, the structures in FIG. 8B including the indentation 11 for accommodating the sample holder 5 are on the platen 30 in a mounting 10 region instead of being on a separable mounting 10. Second, a fastener 15 in FIG. 8B has the form of a clip that extends over the sample holder 5 from a sample side 39 of the platen 30. The clip clamps the sample holder 5 in place. Leveler 70 extends from an opposite side 37 to a sample side 39.

The one or more embodiments depicted employ a platen with a disk-shape (meaning, circular in the plan view and having a small height in the cross-sectional view). However, in one or more embodiments, the platen may have any shape in the plan view, including, but not limited to, oval, square, rectangular, quadrilateral, hexagonal, or polygonal. In one or more embodiments, the platen may be plate-shaped, or may have any other shape or thickness in side view.

As discussed previously, limiting ambient light from illuminating a sample during florescence microscopy is important. Therefore, a platen and a spacer may be configured to prevent ambient light from entering the space between the objective lens and the sample. In one or more embodiments, the platen and the spacer may each be a continuous piece formed from an opaque or non-translucent material. Alternatively, in one or more embodiments, the mounting device may be configured such that all openings and transparent windows can be covered, such as by a window cover as discussed later.

Figure 9:
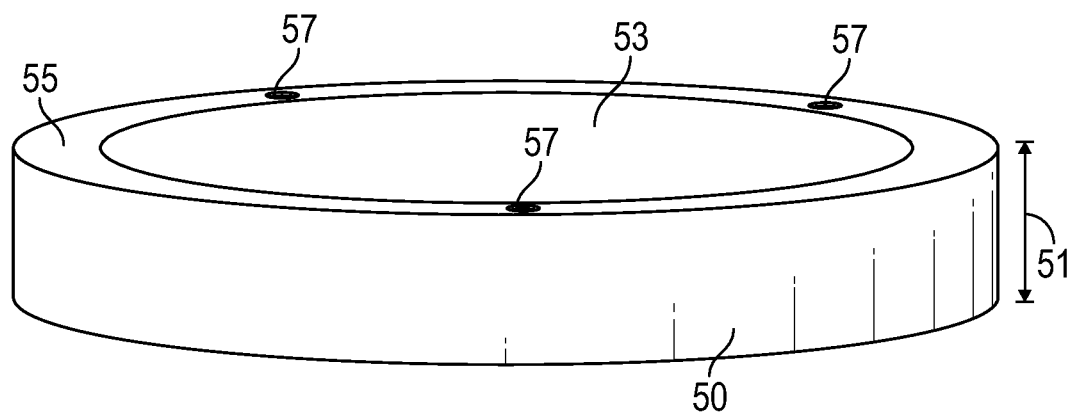
FIG. 9 is a spacer, according to one or more embodiments.

FIG. 9 depicts one embodiment of a spacer 50 having a shape of a hollow cylinder. According to one or more embodiments, the spacer 50 may take the shape of any hollow prism or hollow cylinder having a height 51 and defining a through hole 53. The spacer may also include an edge 55 that extends in the radial direction. In one or more embodiments where a platen 30 and the spacer 50 are separate components, the platen 30 may rest on the edge 55 of the spacer 50 when mounting device 1 (FIG. 4) is fully assembled. In one or more embodiments, the platen 30 and the spacer 50 may be integrally formed from a single material or permanently coupled to one another.

The spacer 50 may be used to properly position the sample 3 for imaging in an inverted microscope. Referring to FIG. 4 and FIG. 9 together, a sample 3 may be attached to the sample holder 5 that is held by a mounting 10 on a platen 30. Further, as discussed previously, the positioning of the sample holder 5 may be adjusted within the mounting 10 to change the precise location of the sample 3 within the mounting device 1. The platen 30 may be inverted onto spacer 50 such that the sample 3 is downward facing so that it may be suspended over an inverted microscope for imaging. Accurate imaging requires the sample 3 be located along the optical axis and within the focal plane of the objective lenses of the inverted microscope.

Accordingly, in view of the requirements for inverted microscopy, the height 51 of the spacer 50 may be determined so the sample 3 in a fully assembled mounting device 1 is a focal length away from an objective lens. Such positioning ensures that sample 3 is within a focal plane of the microscope.

Figure 10:
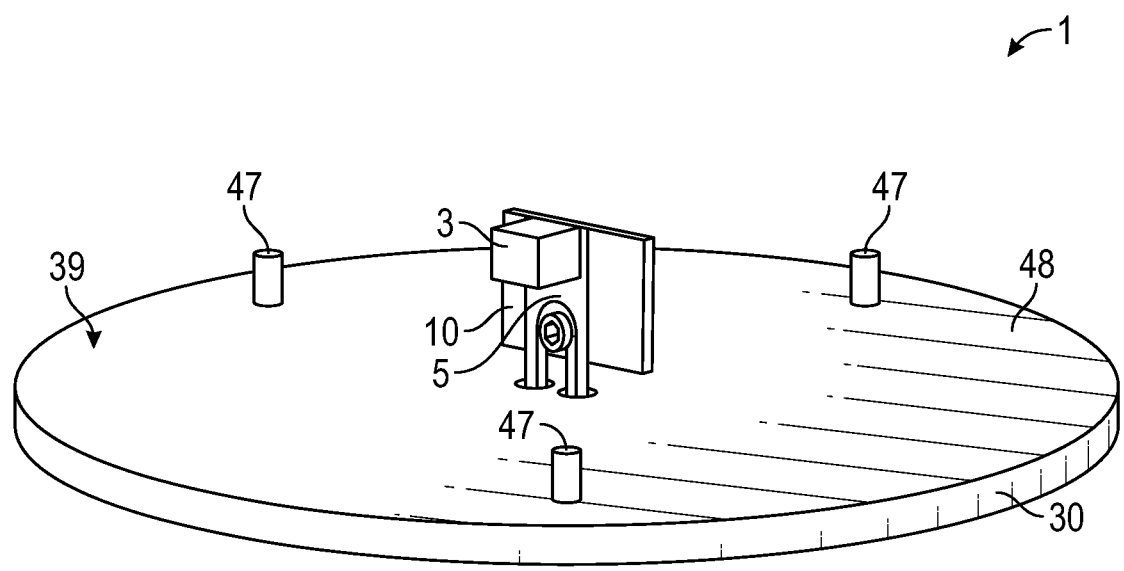
FIG. 10 depicts a platen, according to one or more embodiments.

The platen 30 and the spacer 50 may be separable components that together form a mounting device 1 to hold a sample 3 for inverted microscopy. Referring to FIG. 9 depicting a spacer 50 and FIG. 10 depicting a platen 30 of mounting device 1, a sample 3 may be attached to the sample holder 5 that is held by a mounting 10 on a platen 30. A spacer may be placed on a sample stage of an inverted microscope (FIG. 1B) such that the optical axis extends through the through hole 53 of spacer 50. The platen 30 may be inverted onto spacer 50 such that a peripheral edge 48 of the platen 30 may rest on an edge 55 of the spacer 50. This arrangement places sample 3 downward facing so that it may be suspended over an inverted microscope for imaging. Accurate imaging requires the sample 3 be located along the optical axis and within the focal plane of the objective lenses of the inverted microscope.

The platen 30 and spacer 50 may also have one or more components to temporarily attach and orient the two components. In the embodiments depicted in FIGS. 9 and 10, the platen 30 includes three pins 47 around the peripheral edge 48 while the spacer includes three corresponding blind holes 57 on the edge 55 of the spacer 50. When assembled to form the mounting device, each pin 47 on the platen 30 may each fit into a blind hole 57 on the spacer 50 to position platen 30 and spacer 50 together and to rotationally orient the platen 30 on the spacer 50. The correct orientation may be particularly important when the platen 30 and spacer 50 both have a window, as discussed later. In another embodiment, the pins 47 may instead be located on the spacer 50 and the corresponding blind holes 57 located on the platen 30.

While the one or more embodiments depicted include three pins/blind holes 47, 57 that are equally spaced radially around the components, any number or arrangement of pins/blind holes may also be used in accordance with the present disclosure (for example, at least 1 pair, at least 2 pairs, or at least 3 pairs).

Furthermore, in one or more embodiments, the number of pairs of pins/blind holes 47, 57 may be equal to an integer multiple of the number of sides of the platen 30 in plan view, or may be equal to half the number of sides of the platen 30 in plan view. Put another way, when the platen 30 has the shape of an n-sided polygon when viewed in the plan view, the number of pins and matching blind holes may be equal to n/2, n, 2*n, 3*n, and so on. To illustrate this, consider a platen 30 that has the shape of a hexagonal disk (meaning, n=6) and its corresponding spacer 50 according to one or more embodiments. Said platen 30 and spacer 50 may have a number of pin/blind hole pairs equal to 3, 6, 12, 18, and so on.

In addition to using paired pins and blind holes 47, 57, one having skill in the art will readily appreciate many other methods to temporarily attach the platen 30 to the spacer 50 may include one or more clamps, notches, or adhesives.

Consider a spacer 50 being placed on a microscope stage or stage insert prior to performing microscopy. Some microscope stages or stage inserts may be very smooth or slick. If not altered, the surface of the spacer 50 that rests on the stage may slide or shift during testing. Thus, limiting movement of the spacer 50 on the stage surface may reduce the likelihood that the spacer 50 rotates when adjusting the sample position or leveling prior to imaging and to reduce drift during image acquisition. Said surface of the spacer 50 is often an opposite edge of the spacer 50 axially opposite an edge of the spacer 50 where the platen rests 55. Accordingly, the opposite edge of the spacer 50 may be altered to be less slippery. One having skill in the art will readily appreciate methods to prevent unwanted movement of the spacer 50, and thus of the entire mounting device, on the stage. Two such options, according to one or more embodiments, may include alterations of the opposite edge using a combination of mechanical roughening or non-slip materials such as silicone or other polymers.

Both sample preparation and mounting of a sample 3 into a sample holder 5 may cause the sample 3 to have a tilt compared with the axis of the sample holder 5. Correcting for the tilt of a sample 3 is a common problem in experimental instrumentation. Therefore, a mounting device 1 as depicted in FIG. 4 may further include a leveler 70 that may be used to level the sample 3 once positioned for imaging or spectroscopy. First, a sample 3 that is not level could damage the microscope objective during autofocusing by physically hitting an area of sample 3 that is outside of the field-of-view (FOV) of the microscope. Additionally, a leveled sample 3 allows the user to have better control of the focus of the sample 3 in the FOV of the instrument and when collecting a series of images across the sample 3 surface. For example, one might collect high-resolution images each with a small FOV and then digitally compile them to obtain a large FOV map. Alternatively, one might want to collect a series of images of multiple, disconnected regions of the sample 3 without significant refocusing prior to imaging.

One having skill in the art will readily appreciate the variety, geometry, mechanism, and configuration of leveling systems that may be employed in the mounting device to correct the tilt of the sample. One or more embodiments may include any of a variety of leveling systems, including, but not limited to, screw point leveling, single/multi axis leveling, and goniometry. Those leveling systems may be actuated using one or more actuators having one or more actuation geometries or methods. Additionally, the actuation of the leveler may be controlled manually, electronically, digitally (such as controlled by a controller, computer, or microprocessor), or by a combination of methods. Finally, one or more embodiments may include more than one leveling system, such as for gross versus fine leveling, within a single mounting device. Furthermore, a person of ordinary skill in the art will appreciate the large variety of leveling methods/systems that may be employed by the leveler in addition to those explicitly described herein.

Figure 11A:
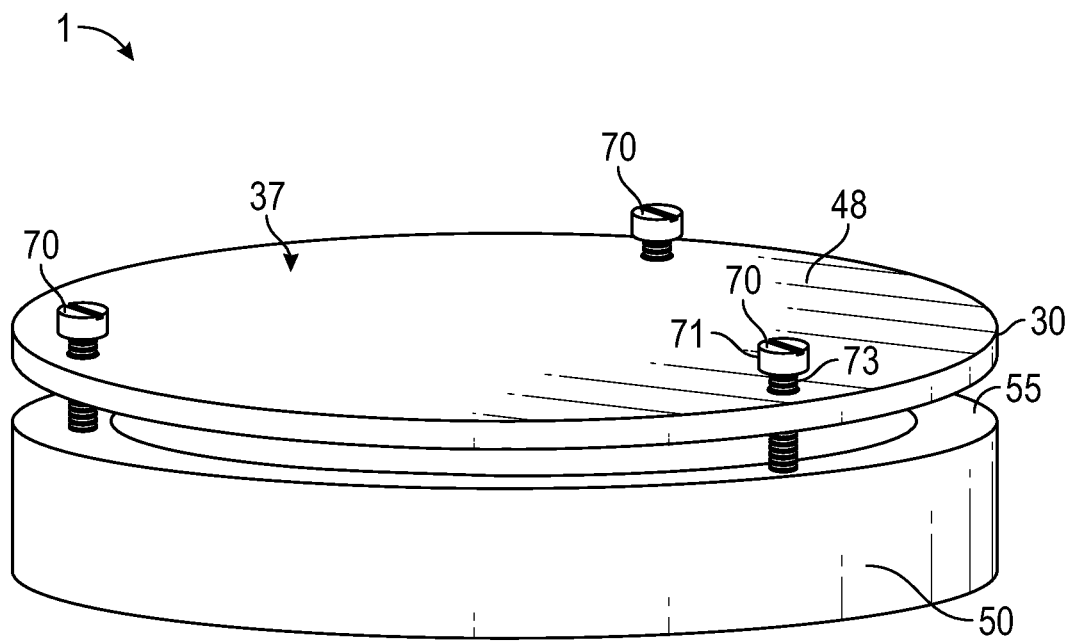
FIGS. 11A and 11B depict a mounting device assembled for use with an inverted microscope and an upright microscope, respectively, according to one or more embodiments.
Figure 11B:
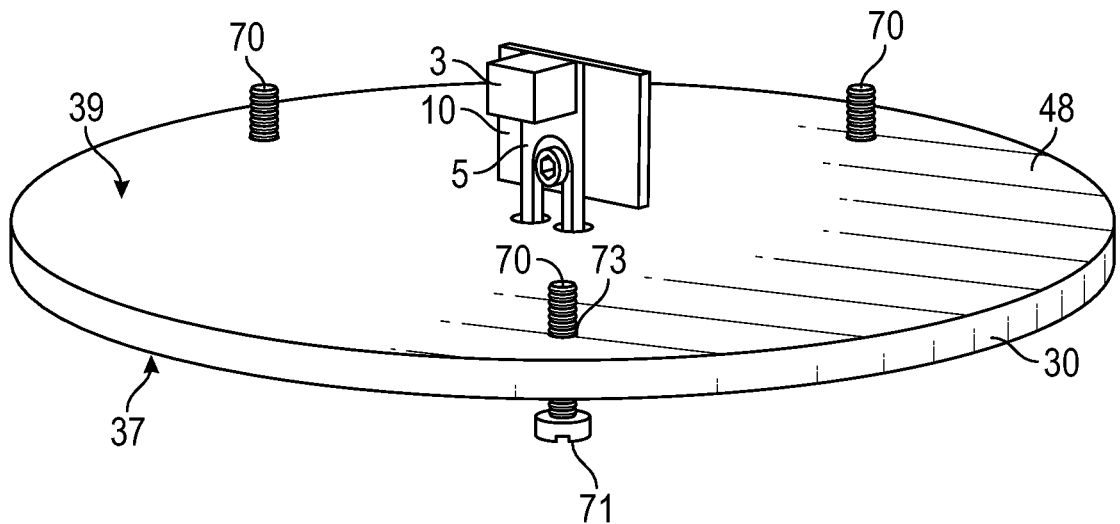

FIGS. 11A and 11B depict an embodiment of a mounting device 1 that employs a leveler 70 in the form of a screw point leveling system, such as the three-point leveling (TPL) system depicted. FIG. 11A depicts an assembled mounting device 1 holding a sample facing down (as for inverted microscopy) and FIG. 11B depicts a mounting device 1 holding the sample 3 facing up (as for upright microscopy or spectroscopy) without a spacer 50.

FIG. 11A shows a mounting device 1 that is fully assembled with a platen 30 atop a spacer 50 according to one or more embodiments. An opposite side 37 of the platen 30 is visible although the sample is hidden from view because it is within the space enclosed by the platen 30 and spacer 50 (See FIG. 4 for a cross-sectional view of a similar device). A leveler 70 can also be seen. In this figure, the leveler 70 takes the form of three screws 71 that have been inserted through three screw holes 73 near a peripheral edge 48 of the platen 30. To assemble, the platen 30 is placed such that an end of each screw 71 rests on an edge 55 of the spacer 50. The exposed length of each screw 71 can be adjusted to raise and lower the platen at the location of each screw 71, thereby changing the angle of the platen 30 to compensate for the tilt of the sample with respect to, for instance, an inverted microscope objective.

Furthermore, one or more embodiments may combine this screw point leveling system with the pin/blind hole system described previously (FIG. 10) to temporarily attach and orient the platen 30 and the spacer 50. In such a system, the screws 71 employed for leveling the sample may also serve as the previously-described pins 47. When assembled to form the mounting device, the screws 71 on the platen 30 may each fit into a blind hole 57 on the edge 55 of the spacer 50 to hold the platen 30 and the spacer 50 and to rotationally orient the platen 30 on the spacer 50.

FIG. 11B depicts the same platen 30 as in FIG. 11A with the sample 3 facing up (as for upright microscopy or spectroscopy). The sample 3 is mounted to a sample holder 5 coupled to a mounting 10 on a sample side 39 of the platen 30. The screws 71 extend from an opposite side 37 to the sample side 39, and the exposed length of each screw 71 may be adjusted. The mounting device 1 without a spacer is resting with the heads of each screw 71 sitting atop a surface such as a microscope stage. Thus, altering the exposed length of each screw 71 changes the distance from the surface to the platen 30, thereby changing the angle of the platen 30 to compensate for the tilt of the sample 3 with respect to, for instance, an upright microscope objective. In some embodiments, the heads of screw 71 may be coated with a non-slip material to inhibit shifting of the mounting device 1 on the microscope stage during imaging.

While the embodiments depicted in FIGS. 11A and 11B have three screws 71 and thus three points of leveling, screw point leveling may use two or more points (for example, 2 points, 3 points, or 4 points). Furthermore, in one or more embodiments, the number of points may be equal to an integer multiple of the number of sides of the platen 30 in plan view, or may be equal to half the number of sides of the platen 30 in plan view. Put another way, when the platen 30 has the shape of an n-sided polygon when viewed in the plan view, the number of points may be equal to n/2, n, 2*n, 3*n, and so on. To illustrate this, consider a platen 30 that has the shape of a hexagonal disk (meaning, n=6) and its corresponding spacer 50 according to one or more embodiments. The leveler 70 may have a number of points of leveling, such as screws 71, equal to 3, 6, 12, or 18, and so on.

Actuation of the screw point leveling system depicted in FIGS. 11A and 11B is a screw actuator that is performed/controlled manually. One or more embodiments may utilize a leveler 70 controlled by a screw actuator or other types of actuator(s) to tilt the sample 3/platen 30 on two or more points (for example, rack and pinion, nut linear, ball screw, roller screw, lead screw, or screw jack). Furthermore, one or more embodiments may operate and control said actuator manually, electronically, digitally, or a combination thereof.

In one or more embodiments, the leveler 70 may employ a rotationally-based, single/multi axis leveling system that includes one or more rotational axis. In one or more embodiments, the rotational axes may be perpendicular to the height of the spacer. Such a system may control a combination of the pitch, roll, and yaw of the sample 3. Said system may have one or more points of rotation, each of which may be located within the sample 3, near the sample 3, or a distance away from the sample 3. In one or more embodiments, the leveler 70 may include one or more goniometers where the point of rotation may be a distance away from the sample 3. The actuation of each axis may be electromechanical/electric such as by a stepper motor or a servomotor or else mechanical such as with a micrometer. Furthermore, one or more embodiments may operate and control said actuator manually, electronically, digitally, or a combination thereof.

In one or more embodiments, the actuation of the leveler 70 may be mechanical, electromechanical, thermal, magnetic, piezoelectric, pneumatic, hydraulic, spring, linear, rotational, screw, geared, electric, rack and pinion, wheel and axle, stepper motor, or any other type of actuation known to the art. Additionally, more than one type of actuation may be used within a single mounting device 1.

Furthermore, one or more embodiments may include a leveler 70 having any type of actuation that may be operated and controlled manually, electronically, digitally (for example, by a controller, computer, or microprocessor), or a combination.

The embodiment depicted in FIGS. 11A and 11B includes a leveler 70 that is located within the platen 30. The leveler 70 functions by changing the angle between the platen 30 and the spacer 50. However, the leveler 70 may be located within any component of the mounting device 1, including the mounting 10, the spacer 50, or the platen 30. Furthermore, the leveler 70, in one or more embodiments, may be a separate component such as a base for the spacer 50 to sit atop or a component disposed between the spacer 50 and the platen 30.

The sample 3 may be leveled when the sample 3 is facing down and a spacer 50 is being used (as for inverted microscopy) as well as when the sample 3 is facing up (as for upright microscopy) either with or without a spacer 50. In some embodiments, the leveler 70 may only be used when the sample 3 is facing down (as for inverted microscopy) and may not be used when the sample 3 is facing up (as for upright microscopy or spectroscopy). In some embodiments, the leveler 70 may only be used when a spacer 50 is being used.

Figure 12A:
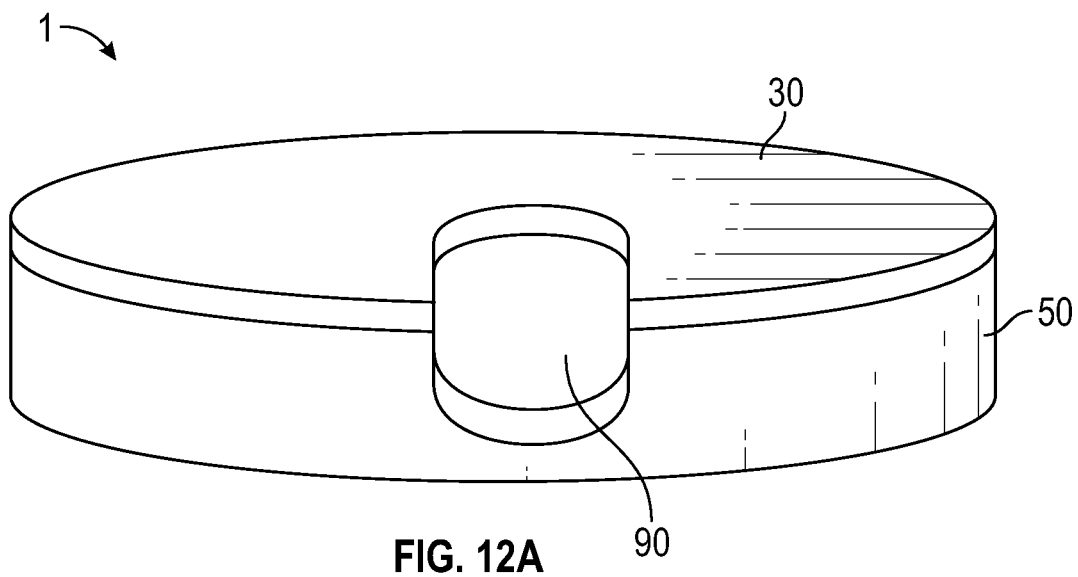
FIGS. 12A-12C shows a mounting device with a window, both with and without a window cover, according to one or more embodiments.

While positioning a sample 3 for inverted microscopy, it may be helpful to directly view the sample (FIG. 4). Accordingly, in one or more embodiments, as depicted in, for example, FIGS. 12A-12C, mounting device 1 may further include a window 90 formed in either a platen 30, a spacer 50, or both. Referring to FIG. 12A, the window 90 has the shape of a half oval in both the platen 30 and in the spacer 50 so together the window is in the shape of an oval. However, the window 90 may be of any size and may take any overall shape (such as round, oval, square, rectangular, triangular, or polygonal) as well as any shape in either of the platen 30 and the spacer 50 (such as round, oval, square, rectangular, triangular, or polygonal). In some embodiments, the window 90 may be entirely in either the platen 30 or the spacer 50.

Figure 12B:
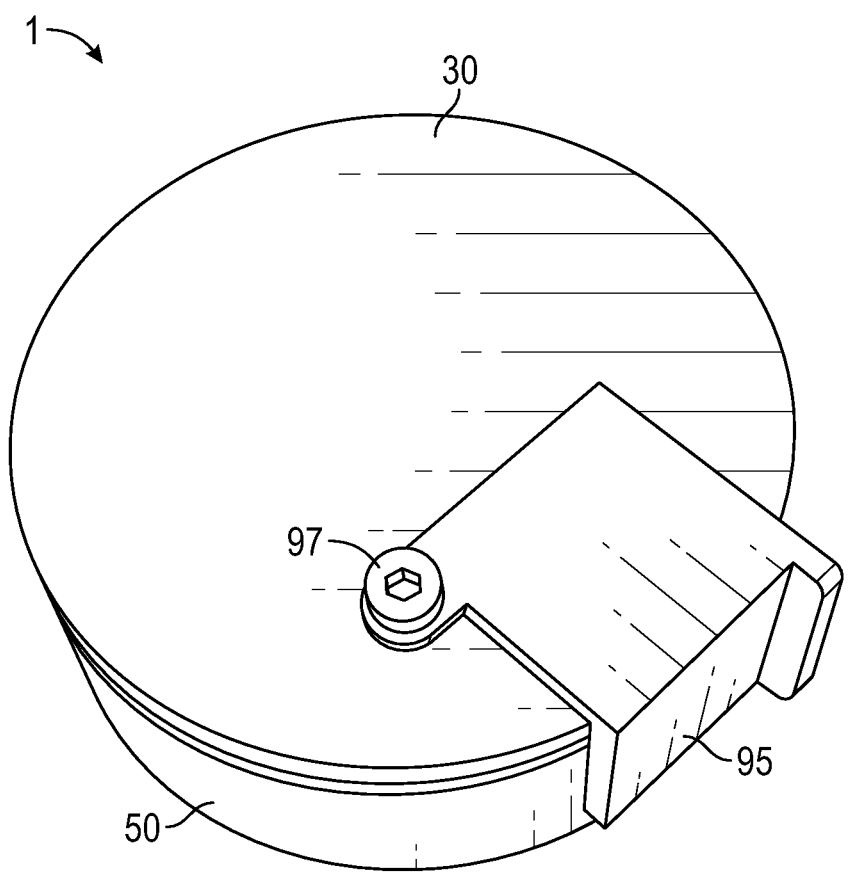
Figure 12C:
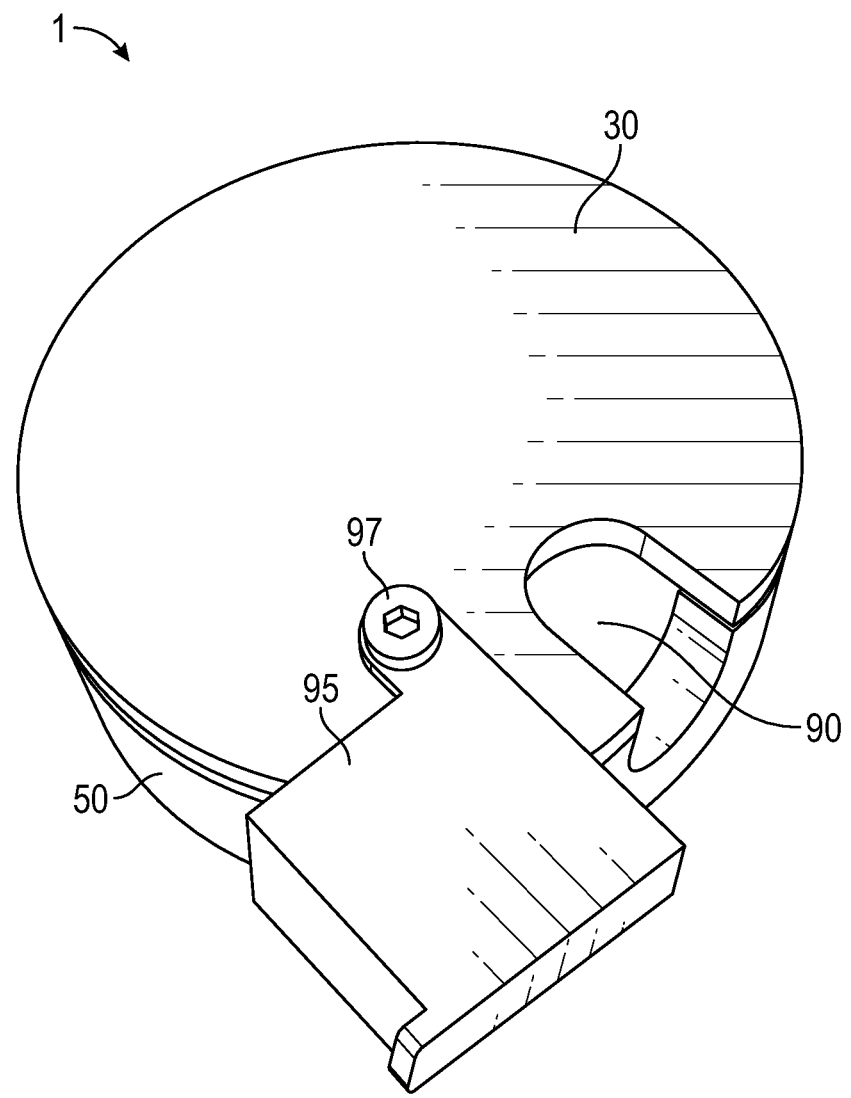

Furthermore, as discussed previously, the sample (FIG. 4) may be shielded from ambient light during florescence microscopy. In one or more embodiments, mounting device 1 may further include a window cover 95 to cover the window 90. FIG. 12B depicts the window cover 95 closed so it covers the window, while FIG. 12C depicts the same window cover 95 open so a user may view the sample (FIG. 4) through the window 90. As shown in FIGS. 12B and 12C, the window cover 95 is attached to a platen 30 with a window cover attachment 97, which in this case is a pin/screw, so the window cover 95 may be opened and closed by pivoting around the window cover attachment 97.

Many additional configurations for the window cover 95 may be devised by a person of ordinary skill in the art, such as a slide mechanism, a flap, a hinge, or a pivot point in a different location. Furthermore, one or more embodiments may include a window cover 95 that may be completely removed from the mounting device 1 to uncover the window 90. Such a window cover 95 according to one or more embodiments may be attached with one or more removable pins, clamps, or screws, or placed or slid in a notch or on a peg. A person of ordinary skill in the art will readily appreciate the wide variety of mechanisms that may be incorporated in the mounting device 1 to removably cover the window 90 with the window cover 95.

Refer again to FIG. 4. Each of the components of mounting device 1, including the platen 30, the spacer 50, the mounting 10, and the window cover 95, may all be fabricated from the same material or from two or more different materials. As discussed previously, florescence microscopy benefits from a darkened environment. Thus, in one or more embodiments, one or more of the platen 30, the spacer 50, and the window cover 95 may be formed of materials that are opaque or non-transparent to shield the measurement from ambient light.

The components that form the mounting device 1, in particular any that face toward the microscope objective such as the platen 30, the spacer 50, the mounting 10, and the window cover 95, may be formed from one or more materials with low fluorescence. "Low florescence" means a material that fluoresces less than the sample of interest within the range of wavelengths emitted by the sample when exposed to the radiation used for florescence microscopy. A material that is non-florescent is one example of a material that would have low florescence compared with a sample of interest. The use of such materials may help limit the florescence of the mounting device 1, which will help improve the quality of florescence microscopy images. Some low florescence materials that may be used in one or more embodiments include metals (for example, aluminum, stainless steel, steel, or titanium) and polymers (for example, polytetrafluoroethylene (PTFE), poly(methyl methacrylate) (PMMA), or high-density polyethylene (HDPE)).

Furthermore, the components that form the mounting device 1, in particular any that face toward the microscope objective such as the platen 30, the spacer 50, the mounting 10, and the window cover 95, may be formed from low reflectivity materials. Reflectivity may be measured by comparing the intensity of the incident light with that of the reflected light. Low reflectivity here means a material that does not reflect a significant fraction of the incident light. The use of such materials may help to limit reflections of stray light that would affect data quality. Some low reflectivity materials that may be used in one or more embodiments include metals (for example, aluminum, stainless steel, steel, or titanium) and polymers (for example, PTFE, PMMA, HDPE). In some cases, a material that has not been modified to have a mirrored finish (for example, via polishing or plating) may have low reflectivity. Furthermore, the surfaces of the mounting device that face the sample may also be treated to lower the reflectivity of the materials, such as by roughening, coating, or etching.

One or more embodiments includes a method for assembling a mounting device 1 (as depicted in FIG. 4) for use in an inverted microscope. A sample 3 may be mounted to a sample holder 5 as depicted in FIGS. 2 and 3A-3B, according to a method well known in the art. The method may depend on the sample type, sample material, sample size, sample holder geometry, sample holder material, experimental needs, and other considerations.

Referring to FIGS. 5A-5B, 6, 8A-8B, and 9, a method for assembling the mounting device 1 may further include removably coupling the sample holder 5 to a sample-attachment side 17 of a mounting 10. The precise method for coupling the sample holder 5 to the mounting 10 will depend on the particular geometry of both the sample holder 5 and the mounting 10. In one embodiment, the one or more protrusions 9 of the sample holder 5 are inserted into the matching one or more indentations 11 of the mounting 10. The sample holder 5 may be temporarily coupled to the mounting 10 using one or more fastener 15. Coupling the sample holder 5 to the mounting 10 as depicted in FIGS. 5A-5B and 8A is performed by tightening a fastener 15 in the shape of a set screw into a backplate 13. Coupling the sample holder 5 to the mounting 10 depicted in FIG. 6 is performed by tightening the fastener 15 having the shape of a set screw within the mounting 10. Coupling the sample holder 5 to the mounting 10 depicted in FIG. 8B is performed by fastening the fastener 15 having the shape of a clip over the sample holder 5. As discussed previously, many other fastener types and geometries may be employed in a mounting device 10 according to one or more embodiments.

As discussed previously, the exact position of the sample holder 5 may be adjustable within the mounting 10. In one or more embodiments, such as those depicted in FIGS. 5A-5B and 6, the height of the sample holder 5 atop the mounting 10 may be adjusted manually in concert with the tightening of fastener 15. As discussed previously, many other adjustment devices and functionalities may be employed to position the sample holder 5 in relation to the mounting device 10, according to one or more embodiments. This adjustment may be done before, simultaneously with, or after coupling the sample holder 5 to the mounting 10, such as via engagement of the fastener 15, depending upon the adjustment method and device.

One or more embodiments of the mounting device 1 may have a platen 30 and a mounting 10 that are separable components. The method for assembling the mounting device 1 may thus further include removably attaching a platen side 19 of the mounting 10 on a sample side 39 of a platen 30 as required by the particular system. This step may occur before or after the sample holder 5 is mounted to the mounting 10.

In one or more embodiments, the mounting device 1 may employ a dovetail pin and dovetail socket system to connect mounting 10 to platen 30. To attach the mounting 10 to the platen 30 depicted in FIG. 7A, a dovetail pin 41 is inserted into a dovetail socket 21.

In one or more embodiments, the mounting device 1 may employ a screw system to connect mounting 10 to platen 30. To attach the mounting 10 to the platen 30 as depicted in FIG. 7B, an attachment 45 in the form of a screw passes through a thread hole 43 and is tightened in a threaded hole 23.

The method for assembling the mounting device 1 may further include placing the spacer 50 on the inverted microscope such that an optical axis of the inverted microscope passes through a through hole 53 of the spacer 50.

After the sample holder 5 has been removably coupled to the platen 30 without or without a separable mounting 10, the method for assembling the mounting device 1 may further include inverting a platen 30 on the spacer 50 with a sample side 39 of the platen 30 facing toward the spacer 50. This may position the sample holder 5 within the through hole 53 such that the sample 3 is along the optical axis. The platen 30 and spacer 50 may be connected before being placed such that an optical axis of the inverted microscope passes through a through hole 53 of the spacer 50. Alternatively, the spacer 50 may be placed so an optical axis of the inverted microscope passes through a through hole 53 of the spacer 50 before the platen 30 is inverted onto and connected to spacer 50.

In one or more embodiments, disposing the platen 30 on the spacer 50 may further include engaging the fastening and orienting components. For instance, if the platen 30 has one or more pins 47 and the spacer has matching one or more blind holes 57 as depicted in FIGS. 9 and 10, assembling the mounting device 1 may further involve properly orienting the platen 30 and the spacer 50, and inserting the pins 47 in the blind holes 57.

As discussed previously, the sample 3 may have a tilt compared to the objective of the inverted microscope created during mounting and fabrication. Thus, the method for assembling the mounting device 1 may further include leveling the sample using a leveler 70 after the platen 30 has been disposed on the spacer 50.

A TPL system is employed as the leveler 70 in the one or more embodiments depicted in FIGS. 11A and 11B. In such a system, leveling the sample using the leveler 70 may include turning one or more of the screws 71 to change the extended length of the end of said screws thereby controlling the length of the screw 71 that extends beyond the platen 30. This adjusts a distance between the platen 30 and the spacer 50, ultimately changing the tilt of the platen 30 to level the sample 3.

In one or more embodiments, the leveler 70 may employ a rotationally-based, single/multi axis leveling system (not depicted) that includes one or more rotational axis. Thus, leveling the sample 3 using the leveler 70 may include rotating the sample about at least one rotational axis that is perpendicular to a height of the spacer. This rotation controls some combination of pitch, roll, and yaw of the sample.

Furthermore, one having skill in the art will appreciate that each type of leveler 70 employed in a mounting device 1 will inherently require leveling to be performed in a prescribed method.

One or more embodiments of the mounting device 1, as depicted in FIGS. 12B and 12C, may further include a window 90 in at least one of the platen 30 and the spacer 50 and a window cover 95. Limiting ambient light may be important in some measurements, as discussed previously. Thus, the method for assembling the mounting device 1 for inverted microscopy may further include closing the window cover 95 over the window 90 before imaging with the inverted microscope to limit ambient illumination of the sample.

Alternatively, mounting device 1 may be used for microscopy or spectroscopy measurements (such as the upright microscope in FIG. 1A) where the sample 3 is sample side up as depicted in FIG. 11B. Many of the steps for assembling and using mounting device 1 in such a situation may be similar to those described previously, such as attaching the sample 3 to the sample holder 5, attaching the sample holder 5 to the sample-attachment side 17 of the mounting 10, adjusting the sample holder 5 within the mounting 10, and attaching the platen side 19 of the mounting 10 to the sample side 39 of the platen 30. However, the platen 30 may be placed on a sample stage 107 of an upright microscope so that the sample side 39 of the platen 30 faces toward the objective lens. Again, leveling with the leveler 70 may be performed to level the sample 3 with respect to the objective lens. However, as depicted in FIG. 11B, the leveler 70 in the form of leveling screws 71 may be oriented with the screw heads down on a surface like the sample stage 107. Alternatively, there may be a separate leveler 70 for use in this orientation that differs from the leveler 70 used when the sample 3 is sample side down. The spacer 50 may or may not be placed atop the sample side 39 of the platen 30, to help limit ambient light for example. Consequently, the platen 30 (along with the sample 3, the sample holder 5, and the mounting 10) may be removed from an upright microscope, inverted so the sample side 39 of the platen 30 is downward, and placed atop the spacer 50 on an inverted microscope such that an optical axis of the inverted microscope passes through a through hole 53 of the spacer 50. This process may also be reversed, whereby the platen 30 with the sample side 39 down may be removed from the spacer 50 atop the inverted microscope, inverted so the sample side 39 of the platen 30 is facing up, and placed on an upright microscope with the opposite side 37 down and the sample side 39 towards the objective lens.

While the scope of what has been disclosed has been described with respect to a limited number of embodiments, those skilled in the art, having benefit of this disclosure, will appreciate that other embodiments not specifically described can be devised that do not depart from the overall scope as disclosed herein. Accordingly, the scope should be limited only by the attached claims.

What is claimed:

1. A mounting device for holding a sample mounted to a sample holder for use in an inverted microscope, the mounting device comprising: a platen; a mounting disposed on a sample side of the platen; and a spacer shaped as a hollow prism or a hollow cylinder having a height and defining a through hole, wherein the platen is disposed on the spacer with the sample side facing toward the spacer and the sample holder positioned within the through hole, wherein the height of the spacer arranges the sample within a focal plane of the inverted microscope, wherein the sample holder is removably coupled to the mounting so the sample is along an optical axis of the inverted microscope; wherein the mounting is integrally formed with the platen; wherein a window in at least one of the platen and the spacer, and a window cover for temporarily covering the window.

2. The mounting device according to claim 1, wherein a position of the sample holder relative to the mounting is adjustable.

3. The mounting device according to claim 1, wherein the spacer and the platen are formed as an integral component.

4. The mounting device according to claim 1, further comprising:
a leveler for leveling the sample.

5. The mounting device according to claim 4,
wherein the leveler comprises:
at least two screws inserted through the platen via at least two screw holes near a peripheral edge of the platen, and
wherein an end of each of the at least two screws extends from the sample side of the platen and contacts an edge of the spacer when the platen is disposed on the spacer.

6. The mounting device according to claim 5,
wherein the spacer further comprises at least two blind holes on an edge of the spacer, and
wherein, when the platen is disposed on the spacer, each of the blind holes receive one of the screws to removably connect and rotationally orient the platen to the spacer.

7. The mounting device according to claim 1,
wherein the platen further comprises at least two pins located near a peripheral edge of the platen and that extend from the sample side,
wherein the spacer further comprises at least two blind holes on an edge of the spacer, and
wherein, when the platen is disposed on the spacer, each of the blind holes receive one of the pins to removably connect and rotationally orient the platen to the spacer.

8. The mounting device according to claim 1,
wherein the sample holder is a scanning electron microscope (SEM) blade having at least one protrusion, and
wherein the mounting further comprises:
at least one indentation disposed on a sample-attachment side of the mounting that accommodates the at least one protrusion of the SEM blade;
a backplate to orient and stabilize the SEM blade; and
at least one fastener that removably holds the SEM blade in the mounting and against the backplate.

9. The mounting device according to claim 1, further comprising:
at least one fastener to removably hold the sample holder in the mounting.

10. A method for assembling a mounting device for use in an inverted microscope, the method comprising: removably coupling a sample holder on a sample-attachment side of a mounting; disposing a platen side of the mounting on a sample side of a platen that is integrally formed with the mounting; placing a spacer on the inverted microscope such that an optical axis of the inverted microscope passes through a designated through hole through the spacer; disposing the platen on the spacer with the sample side of the platen facing toward the spacer such that the sample holder is positioned within the through hole and a sample is along the optical axis and within a focal plane; and closing a window cover over a window in at least one of the platen and the spacer to limit ambient illumination of the sample.

11. The method for assembling the mounting device according to claim 10, the method further comprising:
leveling the sample using a leveler.

12. The method of assembling the mounting device according to claim 10,
wherein removably mounting the sample holder on the sample-attachment side of the mounting comprises:
inserting at least one protrusion of the sample holder into an indentation in the mounting; and
fastening the sample holder to the mounting using at least one fastener.

13. A method for assembling a mounting device for use in microscopes, the method comprising: removably mounting a sample holder on a sample-attachment side of a mounting; disposing a platen side of the mounting on a sample side of a platen that is integrally formed with the mounting; placing the platen on an upright microscope with the sample side of the platen facing toward an objective lens; removing the platen from the upright microscope and inverting the platen together with the mounting; disposing the inverted platen on a spacer with the sample side of the platen facing toward the spacer; placing the spacer and the inverted platen on an inverted microscope such that an optical axis of the inverted microscope passes through a through hole defined by the spacer; and removably mounting the sample holder on the sample-attachment side of the mounting comprises: inserting at least one protrusion of the sample holder into an indentation in the mounting; and fastening the sample holder to the mounting using at least one fastener.

14. The method for assembling the mounting device according to claim 13, the method further comprising:
leveling a sample disposed in the sample holder using a leveler.

* * * * *